United States Patent
Matsushima

[11] Patent Number: 5,598,160
[45] Date of Patent: Jan. 28, 1997

[54] SIGNAL PROCESSING CIRCUIT WITH BUILT-IN DYNAMIC RANGE MATCHING

[75] Inventor: Makoto Matsushima, Minoo, Japan

[73] Assignee: Ricoh Company, Ltd., Tokyo, Japan

[21] Appl. No.: 320,686

[22] Filed: Oct. 11, 1994

[30] Foreign Application Priority Data

Oct. 14, 1993 [JP] Japan .................................. 5-257052

[51] Int. Cl.$^6$ .............................. H03M 1/12; H03M 1/06
[52] U.S. Cl. ............................................ 341/155; 341/118
[58] Field of Search ...................................... 341/131, 118, 341/120, 155

[56] References Cited

U.S. PATENT DOCUMENTS

| | | | |
|---|---|---|---|
| 4,297,893 | 11/1981 | Weinstein | 73/861 |
| 4,768,018 | 8/1988 | Noujaim | 340/347 AD |
| 4,804,925 | 2/1989 | Iwase et al. | 329/50 |
| 5,287,019 | 2/1994 | Nonana et al. | 307/475 |
| 5,399,960 | 3/1995 | Gross | 323/313 |

OTHER PUBLICATIONS

Yoichi Saito, "Adaptive Compensation of Various Linear Distortions for π/4–QPSK Differential Detection," Technical Report of the Institute of Electric Information and Communication Engineers, RCS92–101 (Jan. 1993).

Primary Examiner—Jeffrey A. Gaffin
Assistant Examiner—Jason L. W. Kost
Attorney, Agent, or Firm—Cooper & Dunham LLP

[57] ABSTRACT

A level-controlling unit consisting of an inverter controls a level of a given pulse signal, the level controlling being performed in a predetermined manner. An analog-signal producing unit consisting of a low-pass filter produces an analog signal by integrating the pulse signal having undergone the level controlling. An analog-signal processing unit consisting of A-D converter processes the analog signal with a dynamic range thereof so as to supply a digital signal, the dynamic range being defined by a predetermined reference level. The predetermined manner is such that a substantial possible level variation extent of the analog signal received by the analog-signal processing unit corresponds to the dynamic range.

9 Claims, 3 Drawing Sheets

AM

FM

PM

SIGNAL PROCESSING CIRCUIT WITH BUILT-IN DYNAMIC RANGE MATCHING

BACKGROUND OF THE INVENTION

1. Field of the Invention

The present invention relates to an analog/digital-signal circuit including an analog-signal circuit and a digital-signal circuit.

2. Related Art

Such an analog/digital-signal circuit in the related art is, for example, a demodulating circuit for demodulating a digital signal obtained as a result of modulation through a digital modulating process such as phase-shift keying (which will be abbreviated to "PSK", hereinafter).

The PSK modulating method will now be briefly described. To transmit a digital signal, it is necessary to modulate a carrier wave using a pulse series of the digital signal. One method of methods for the modulation is the PSK modulation method. The PSK modulation method is a pulse modulation method, that is, a method for modulating the carrier wave using the pulse series, of a well-known PM (Phase Modulation) method, one of methods AM, FM and PM used for modulating a carrier wave with a signal including an analog signal. FIGS. 3A, 3B and 3C indicate wave shapes resulting from modulating the carrier wave using a pulse signal of a pulse series (0, 1, 1, 0, 1, 0, 0, 1), according to AM (Amplitude Modulation), FM (Frequency Modulation), and PM, being called respectively ASK (Amplitude Shift Keying), FSK (Frequency Shift Keying), and PSK for the pulse modulation. A received sine-wave PSK signal such as that shown in FIG. 3C is converted into a rectangular-wave through well-known pulse technology, and an input signal to the circuits shown in FIGS. 1 and 2 is produced.

FIGS. 4A and 4B show a 2PSK method and a 4PSK method, respectively. In the 2PSK method, as shown in FIG.4A, as a result of the modulation, a "0" of the pulse series corresponds to a phase of the modulated carrier wave rotated by $\pi$ radians, that is, 90°, from a phase of the modulated carrier wave corresponding to a "1" of the pulse series. In the 4PSK method, as shown in FIG.4B, four different phases, rotated by $\pi/2$ radians, that is, 45°, from one another, of the modulated carrier wave are used to carry the pulse signal.

With reference to FIG. 1, the demodulating circuit will now be described. The demodulating circuit includes a first digital logic circuit 101, a low-pass filter 102, an analog-to-digital converter (which will be referred to as an A-D converter, hereinafter) 103, and a second digital logic circuit 104. The two digital logic circuits 101 and 104 are driven by a digital-system power source 110, and the low-pass filter 102 and the A-D converter 103 are driven by an analog-system power source 111. A reference top voltage is supplied by a voltage source 120 to the A-D converter 103 and a reference bottom voltage is supplied by a voltage source 121 to the A-D converter 103.

Operation of the above-described circuit will now be described. The first digital logic circuit 101 generates a pulse signal carrying phase comparison information which is obtained as a result of mixing An input signal and a reference signal through a digital mixer. The pulse signal carrying phase comparison information is such as that shown in FIGS. 6 and 7 described later. The digital mixer, simply consisting of an exclusive-OR (XOR) operation unit, obtains a phase difference between the input signal and the reference signal. The resulting pulse signal is converted into an analog signal through the low-pass filter 102 as a result of the low-pass filter 102 removing high-frequency components from the pulse signal. The analog signal is quantized through the AD converter 103 in a range between the reference top voltage and reference bottom voltage supplied by the voltage sources 120 and 121. The quantized data is appropriately processed by the second digital logic circuit so that data reproduction is performed from the input signal.

A principle of the data reproduction operation performed by the demodulating circuit shown in FIG. 1 will now be described with reference to FIGS. 5, 5–7. The digital mixer of the logic circuit 101 consists of the XOR operation unit (XOR) as mentioned above. As shown in FIG. 5, the modulated signal (MODSIG) and the reference signal (REFSIG) are input to the XOR (XORSGI), and the output of the XOR is filtered by the LPF 102 and A-D converted by the A-D converter 103. As shown in FIG. 6, if a phase difference $\delta\phi$ between the modulated signal and the reference signal is relatively small, each of pulse spans of the output of the XOR is short accordingly. The short pulse spans are integrated by the LPF 102, respectively, and thus the output of the LPF 102 has a small value. If the phase difference $\delta\phi$ between the modulated signal and the reference signal is relatively large, each of pulse spans of the output of the XOR is long accordingly. The long pulse spans are integrated by the LPF 102, respectively, and thus the output of the LPF 102 has a large value. Thus, an integrated value of the phase difference $\delta\phi$ between the modulated signal and the reference signal is obtained. As a result, the modulated signal which was obtained through the above-described PSK method is demodulated, that is, data reproduction is performed.

The reference voltage values of the reference top voltage and the reference bottom voltage are determined depending on a gain of the low-pass filter 102. The reference voltage values have to be determined accurately to match an output level of the low-pass filter 102. This is because demodulating accuracy of the demodulating circuit may be greatly degraded if the reference voltage values do not accurately match the output level of the low-pass filter 102.

In order to obtain such demodulating accuracy at a high level, a provision is made, in such a demodulating circuit in the related art, to appropriately adjust such reference voltage values as those of the reference top voltage and reference bottom voltage supplied by the voltage sources 120 and 121. The above provision adjusts the above reference voltage values according to various causes which affect the matching of the reference voltage values with the output level of an analog-signal producing circuit such as the low-pass filter 102. The above various causes may include offset errors and functional-value dispersion due to integrated-circuit manufacturing processes of analog-signal circuits included in the analog-signal producing circuit.

SUMMARY OF THE INVENTION

An object of the present invention is to provide an analog/digital-signal circuit for which adjustment of such reference voltage values is not necessary.

In order to achieve the above object, an analog/digital-signal circuit according to the present invention is provided. The analog/digital-signal circuit comprises:

level-controlling means for controlling a level of a given pulse signal, the level controlling being performed in a predetermined manner;

analog-signal producing means for producing an analog signal by integrating said pulse signal having undergone said level controlling; and analog-signal processing means for processing said analog signal with a dynamic range thereof, said dynamic range being defined by a predetermined reference level;

and said predetermined manner being such that a substantial possible level variation extent of said analog signal received by said analog-signal processing means corresponds to said dynamic range.

In the above circuit, the level of the pulse signal is controlled by the level-controlling means so that the level of the pulse signal supplied to the analog-signal producing means has a certain level. The certain level of the pulse signal is appropriate such that the analog-signal producing means outputs the analog signal having the level matching the dynamic range of the analog-signal processing means. Specifically, a substantial possible level variation extent of the analog signal corresponds to the dynamic range. Thus, the quantization is effectively performed by the analog-signal processing means using the full scale of the dynamic range.

Further, the level of the analog signal is thus controlled prior to reception of the analog signal by the analog-signal processing means. The controlling is performed such that the level of the analog signal received by the analog-signal processing means matches with the dynamic range of the analog-signal processing means. The dynamic range is defined by the predetermined reference level. Adjustment of the predetermined reference level is performed, in the related art, in order to prevent the above matching of the level of the analog signal, received by the analog-signal processing means with the dynamic range of the analog-signal processing means, from being adversely affected. The adverse affecting may be performed by various causes such as offset errors of the analog-signal processing means, functional-value dispersion due to integrated-circuit manufacturing, or a gain of the analog-signal producing means. However, according to the present invention, because of the above-described prior analog-signal level control, the adjustment the predetermined reference level is not necessary.

Since the adjustment of the predetermined reference level is not necessary, it is easy to manufacture the analog/digital-signal circuit in a mass production manner.

Other objects and further features of the present invention will become more apparent from the following detailed description when read in conjunction with the accompanying drawings.

DESCRIPTION OF THE PREFERRED EMBODIMENTS

Figure 2:
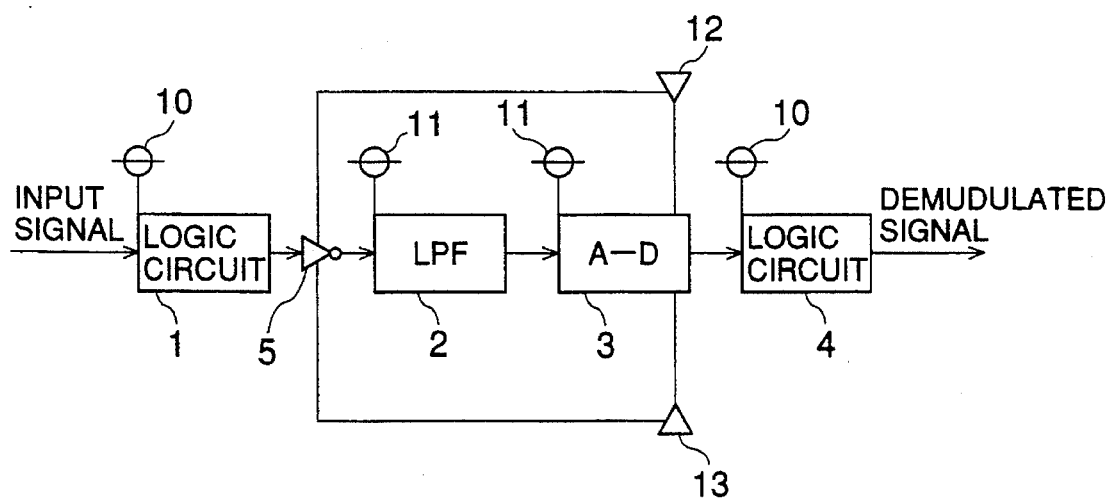
FIG. 2 shows a circuit diagram of a demodulating circuit in a first embodiment of an analog/digital-signal circuit according to the present invention.
Figure 3A:
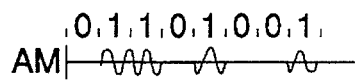
FIGS. 3A, 3B and 3C show carrier waves modulated according to AM, FM and PM.
Figure 3B:
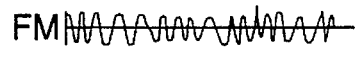
Figure 3C:
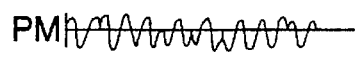
Figure 4A:
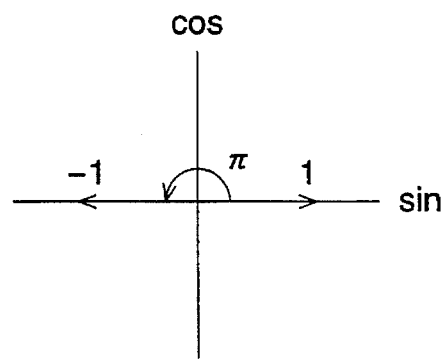
FIGS. 4A and 4B illustrate a PSK modulation method.
Figure 4B:
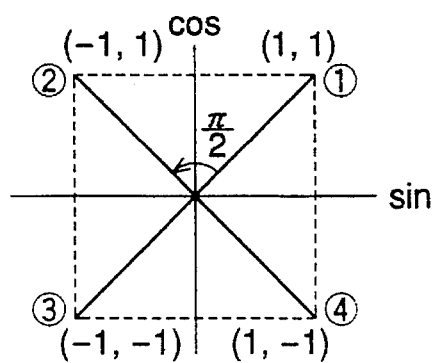
Figure 5:
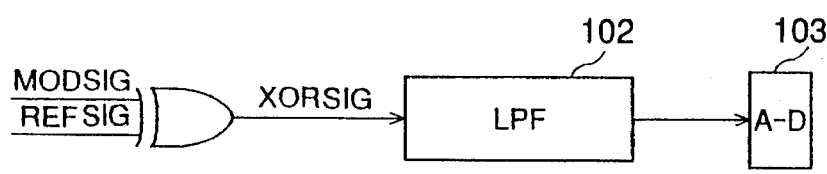
FIG. 5 shows a part of the demodulating circuit shown in FIG. 1 for describing the principle of a data reproduction operation.
Figure 6:
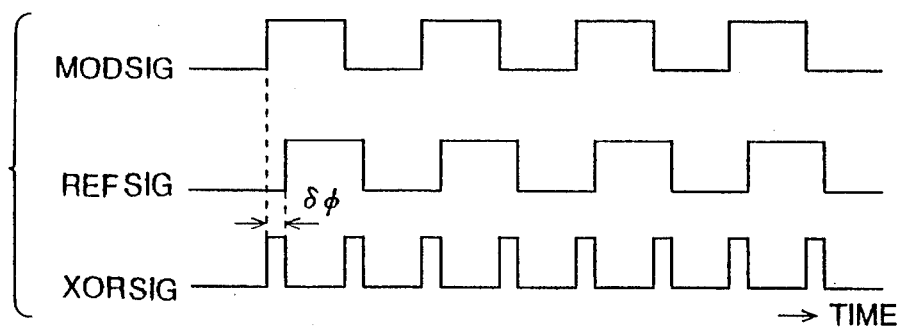
FIG. 6 shows waveforms of the signals in FIG. 5.
Figure 7:
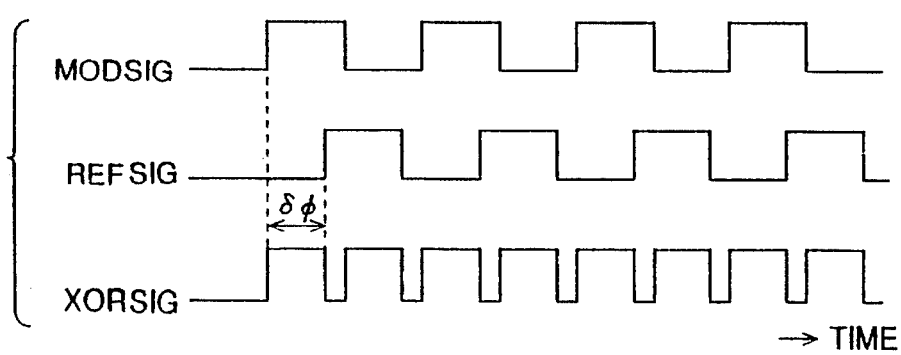
FIG. 7 shows waveforms of the signals in FIG. 5.

With reference to FIG. 2, an analog/digital signal circuit in a first embodiment of the present invention will now be described.

Figure 1:
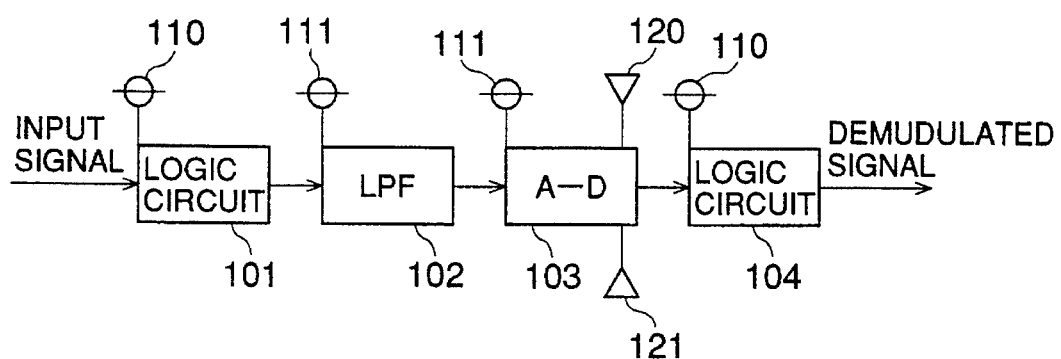
FIG. 1 shows a circuit diagram of a demodulating circuit of an analog/digital-signal circuit in the related art.

The analog/digital signal circuit in the first embodiment of the present invention is a demodulating circuit for demodulating a digital signal obtained as a result of modulating original data through a digital modulating process such as PSK. The demodulating circuit includes a first digital logic circuit 1, a low-pass filter 2 acting as an analog-signal producing circuit, an A-D converter 3 acting as an analog-signal processing circuit, a second digital logic circuit 4, and an inverter 5 acting as a level-controlling digital circuit. The above-mentioned logic circuit 1, low-pass filter 2, A-D converter 3 and logic circuit 4 are substantially identical to the logic circuit 101, low-pass filter 102, A-D converter 103 and logic circuit 104 shown in FIG. 1, respectively. However, a gain of the low-pass filter 2 is designed to be "1".

The two digital logic circuits 1 and 4 are driven by a digital-system power source 10, and the low-pass filter 2 and the A-D converter 3 are driven by an analog-system power source 11. A reference top voltage is supplied by a voltage source 12 to the A-D converter 3 and a reference bottom voltage is supplied by a voltage source 13 to the A-D converter 3. The two reference top and bottom voltages are fixed voltages.

The inverter 5 operates using the reference top and bottom voltages supplied by the voltage sources 12 and 13. Thus, a driving voltage source and a reference voltage of the inverter 5 are the same as the reference top and bottom voltages applied to the A-D converter 3.

Operation of the above-described circuit will now be described. The first digital logic circuit 1 generates a pulse signal carrying phase comparison information which is obtained as a result of mixing an input signal and a reference signal through a digital mixer. The pulse signal is inverted by the inverter 5.

The inverter 5 outputs voltages having "L" and "H" levels in response to the pulse signal received by the inverter 5. The voltages are determined according to the reference top and bottom voltages supplied by the voltage sources 12 and 13. Thus, voltage levels of the pulse signal, having been passed through the inverter 5, are controlled to be within an extent between the reference top and bottom voltages supplied by the voltage sources 12 and 13.

As a result, since the gain of the low-pass filter 2 is designed to be "1" as mentioned above, a voltage level of an analog signal, obtained as a result of the pulse signal being passed through the inverter 5 and then high-frequency components being removed therefrom, is level matched with a dynamic range of the A-D converter 3. The dynamic range of the A-D converter 3 is determined according to the reference top and bottom voltages supplied by the voltage sources 12 and 13. That is, the highest end voltage of the dynamic range is the same as the reference top voltage and the lowest end voltage of the dynamic range is the same as the reference bottom voltage. Thus, a substantial possible voltage-level variation extent of the analog signal output from the low-pass filter 2 corresponds to the dynamic range of the A-D converter 3. The analog signal having the level matching the dynamic range of the A-D converter 3 is quantized by the A-D converter 3. As a result, the quantization is performed using the full-scale of the dynamic range of the A-D converter 3 for the level of the received analog signal. As a result, demodulation accuracy of the demodulating circuit can be improved.

Further, the inverter 5 controls the voltage levels of the pulse signal and the gain of the low-pass filter 2 is "1" so that the voltage level of the analog signal obtained through the inverter 5 and low-pass filter 2 matches the dynamic range of the A-D converter 3. Thus, adjustment of the reference top and bottom voltages supplied by the voltage sources 12 and 13 is not necessary. Therefore, mass production of such a demodulating circuit can be easily performed.

Further, the present invention is not limited to the above-described embodiments, and variations and modifications may be made without departing from the scope of the present invention.

What is claimed is:

1. A signal processing circuit comprising:

level-controlling means for controlling a level of a given pulse signal, the level controlling being performed in a predetermined manner;

analog-signal producing means for producing an analog signal by integrating said pulse signal having undergone said level controlling; and analog-signal processing means for processing said analog signal with a dynamic range thereof, said dynamic range being defined by a predetermined reference level, wherein the level controlling is performed in the predetermined manner such that a substantial possible level variation extent of said analog signal received by said analog-signal processing means corresponds to said dynamic range.

2. The signal processing circuit according to claim 1, wherein said level controlling is performed using said predetermined reference level.

3. The signal processing circuit according to claim 2, wherein:

said analog-signal producing means comprises a low-pass filter; and a gain of said low-pass filter 2 is designed to be "1".

4. The signal processing circuit according to claim 1, wherein:

said analog-signal producing means comprises a low-pass filter; and said analog-signal processing means comprises an analog-digital converter for converting said analog signal into a digital signal by quantizing said analog signal with said dynamic range.

5. The signal processing circuit according to claim 4, wherein:

said analog/digital-signal circuit comprises a demodulating circuit for demodulating a signal that has been modulated by a phase-shift-keying digital modulating process.

6. The signal processing circuit according to claim 5, further comprises:

a first logic circuit comprising a digital mixer mixing an input signal with a reference signal so as to produce said given pulse signal carrying phase comparison information; and a second logic circuit processing said digital signal supplied by said analog-digital converter so as to obtain demodulated data.

7. The signal processing circuit according to claim 5, wherein said demodulating circuit demodulates a signal obtained as a result of modulating, a digital signal, according to a phase-shift keying method.

8. The signal processing circuit according to claim 1, wherein said predetermined reference level comprises a reference top voltage and a reference bottom voltage defining said dynamic range.

9. The signal processing circuit according to claim 8, wherein:

said level-controlling means comprises an inverter having an output with a driving voltage and a reference voltage corresponding to said reference top voltage and said reference bottom voltage.

* * * * *